United States Patent
Verbeck et al.

(10) Patent No.: US 8,651,048 B2
(45) Date of Patent: Feb. 18, 2014

(54) CONTROLLED DEPOSITION OF METAL AND METAL CLUSTER IONS BY SURFACE FIELD PATTERNING IN SOFT-LANDING DEVICES

(75) Inventors: Guido Fridolin Verbeck, Plano, TX (US); Stephen Davila, Odessa, TX (US)

(73) Assignee: University of North Texas, Denton, TX (US)

( * ) Notice: Subject to any disclaimer, the term of this patent is extended or adjusted under 35 U.S.C. 154(b) by 483 days.

(21) Appl. No.: 13/090,123

(22) Filed: Apr. 19, 2011

(65) Prior Publication Data

US 2011/0269619 A1 Nov. 3, 2011

Related U.S. Application Data

(60) Provisional application No. 61/326,431, filed on Apr. 21, 2010.

(51) Int. Cl.
| | |
|---|---|
| C23C 14/34 | (2006.01) |
| C23C 14/46 | (2006.01) |
| C23C 14/48 | (2006.01) |
| C23C 14/22 | (2006.01) |

(52) U.S. Cl.
USPC ............ 118/723 CB; 118/715; 118/722; 118/723 R; 118/723 VE

(58) Field of Classification Search
USPC .......... 118/715, 722, 723 R, 723 VE, 723 CB
See application file for complete search history.

(56) References Cited

U.S. PATENT DOCUMENTS 5,948,703 A 9/1999 Shen et al.
7,081,617 B2 7/2006 McLean et al.
2005/0189485 A1* 9/2005 McLean et al. ............... 250/287
2009/0011953 A1 1/2009 Cooks et al.

OTHER PUBLICATIONS

Abbet, Stephane, et al., "Synthesis of Monodispersed Model Catalysts Using Softlanding Cluster Deposition," Pure Appl. Chem., (2002), vol. 74, No. 9, pp. 1527-1535.
Alvarez, Jormarie, et al., "Preparation and in Situ Characterization of Surfaces Using Soft Landing in a Fourier Transform Ion Cyclotron Resonance mass Spectrometer," Anal. Chem., (2005), 77:3452-3460.
Asbury, G. Reid, et al., "Evaluation of Ultrahigh Resolution Ion Mobility Spectrometry as an Analytical Separatin Device in Chromatographic Terms," J. Microcolumn Separations, (2000), 12(3):172-178.

(Continued)

*Primary Examiner* — Dah-Wei Yuan
*Assistant Examiner* — Stephen Kitt
(74) *Attorney, Agent, or Firm* — Edwin S. Flores; Chainey P. Singleton; Chalker Flores, LLP

(57) ABSTRACT

A soft-landing (SL) instrument for depositing ions onto substrates using a laser ablation source is described herein. The instrument of the instant invention is designed with a custom drift tube and a split-ring ion optic for the isolation of selected ions. The drift tube allows for the separation and thermalization of ions formed after laser ablation through collisions with an inert bath gas that allow the ions to be landed at energies below 1 eV onto substrates. The split-ring ion optic is capable of directing ions toward the detector or a landing substrate for selected components. The inventors further performed atomic force microscopy (AFM) and drift tube measurements to characterize the performance characteristics of the instrument.

10 Claims, 6 Drawing Sheets

(56) References Cited

OTHER PUBLICATIONS

Blake, Thomas A., et al., "Preparative Linear Ion Trap Mass Spectrometer for Separation and Collection of Purified Proteins and Peptides in Arrays Using Ion Soft Landing," Anal. Chem., (2004), 76:6293-6305.
Cooks, R. Graham, et al., "Collisions of Organix Ions at Surfaces," Applied Surface Science 231-232, (2004), pp. 13-21.
Doye, Jonathan P.K., et al., "Magic Numbers and Growth Sequences of Small Face-Centered Cubic and Decahedral Clusters," Chemical Physics Letters, (1995), 247:339-347.
Dugourd, Philippe, et al., "High-Resolution Ion Mobility Studies of Sodium Chloride Nanocrystals," Chemical Physics Letters, (1997), 267:186-192.
Franchetti, V., et al., "Soft Landing of Ions as a Means of Surface Modification," International Journal of Mass Spectrometry and Ion Physics, (1977), 23:29-35.
Gafner, S.L., et al., "Formation of Structural Modifications in Copper Nanoclusters," Physics of the Solid State, (2007), vol. 49, No. 8, pp. 1558-1562.
Geohegan, David B., "Fast Intensified-CCD Photography of YBa2Cu3O7-x Laster Ablation in Vacuum and Ambient Oxygen," Appl. Phys. Letters, Jun. 1992, 60 (22):2732-2734.
Grigoryan, Valeri G., et al., "Structure and Energetics of Cun Clusters with (2<:N<150): An Embedded-Atom-Method Study," Physical Review, (2006), pp. 115415-0-115415-13.
Hadjar, Omar, et al., "Design and Performance of an Instrument for Soft Landing of Biomolecular Ions on Surfaces," Anal. Chem., (2007), 79:6566-6574.
Henley, Like, et al., "The Growth and Modification of Materials via Ion-Surface Processing," Surface Science, (2002), pp. 500-522.
Hill, Jr., Herbert H., et al., "Ion Mobility Spectrometry," Analytical Chemistry, Dec. 1, 2990, vol. 62, No. 23, 9 pages.
Hornbeck, John A., et al., "Cross Sections for Ion-Atom Collisions in He, Ne, and A," Phys. Rev., (1951), 82:458.
Jacobson, D.B., et al., "Heteronuclear Diatomic Transition—Metal Cluster Ions in the Gas Phase. The Bond Energy of FeCo+," J. Am. Chem. Soc., (1984), vol. 106, pp. 4623-4624.
Kemper, Paul R., et al., "Electronic-State Chromatography: Application to First-Row Transition-Metal Ions," J. Phys. Chem., (1991), vol. 95, pp. 5134-5146.
Leuchtner, R.E., et al., "Metal Cluster Cation Reactions: Carbon Monoxide Associated to Cu+n Ions," The Journal of Chemical Physics, (1990), vol. 92, No. 11, pp. 6527-6537.
Matsuki, Nobuyuki, et al., "Heteroepitaxial Growth of Gallium Nitride on Muscovite Mica Plates by Pulsed Laser Deposition," Solid State Communications, (2005), vol. 136, pp. 338-341.
Mayer, Philip S., et al., "Preparative Separation of Mixtures by Mass Spectrometry," Anal. Chem, (2005), vol. 77, pp. 4378-4384.
McDaniel, E.W., et al., "Tests of the Wannier Expressions for Diffusion Coefficients of Gaseous Ions in Electric Fields," Physical Review A, Mar. 1971, vol. 3, No. 3, 5 pages.
van Oosterhout, G.W., "Morphology of Synthetic Submicroscopic Crystals of x and y FeOOH and of yFE2O3 Prepared from FeOOH," Acta Cryst., (1960), vol. 13, pp. 932.
Ouyang, Zheng, et al., "Preparing Protein Microarrays by Soft-Landing of Mass—Selected Ions," Science, (2003), vol. 301, pp. 1351-1354.
Paszti, Z., et al., "Pressure Dependent Formation of Small Cu and Ag Particles During Laser Ablation," Applied Surface Science, (1997), vol. 109, pp. 67-73.
Peng, Wen-Ping, et al., "Ion Soft Landing Using a Rectilinear Ion Trap Mass Spectrometer," Anal. Chem., (2008), vol. 80, pp. 6640-6649.
Powers, D.E., et al., "Supersonic Copper Clusters," The Journal of Chemical Physics, (1983), vol. 78, pp. 2866-2881.
Revercomb, H.E., et al., "Theory of Plasma Chromatography/Gaseous Electrophoresis—A Review," Analytical Chemistry, Jun. 1975, vol. 47, No. 7, pp. 970-983.
Rokushika, Souji, et al., "Resolution Measurement for Ion Mobility Spectrometry," Anal. Chem., (1985), vol. 57, pp. 1902-1907.
Smith, Lloyd P. et al., "On the Separation of Isotopes in Quantity by Electromagnetic Means," The Physical Review, Second Series, Dec. 1, 1947, vol. 72, No. 11, pp. 989-1002.
Verbeck, Guido F., et al., "Resolution Equations for High-Field Ion Mobility," J. A. Soc. Mass. Spectrom, (2004), vol. 15, pp. 1320-1324.
Volny, Michael, et al., "Preparative Soft and Reactive Landing of Multiply Charged Protein Ions on a Plasma-Treated Metal Surface," Anal. Chem., (2005), vol. 77, pp. 4890-4896.
Wannier, Gregory H., "Motion of Gaseous Ions in Strong Electric Fields," Bell Syst. Tech., (1953), 32, 85, pp. 170-188.
Wannier, G.H., The Bell System Technical Journal, Jan. 1953, pp. 190-210.
Wannier, G.H., The Bell System Technical Journal, Jan. 1953, pp. 212-224.
Wannier, G.H., The Bell System Technical Journal, Jan. 1953, pp. 226-238.
Wannier, G.H., The Bell System Technical Journal, Jan. 1953, pp. 240-254.
Watts, P., et al., "On the Resolution Obtainable in Practical Ion Mobility Systems," International Journal of Mass Spectrometry and Ion Processes, (1992), vol. 112, pp. 179-190.
Wijesundara, Muthu B.J., et al., "Preparation of Chemical Gradient Surfaces by Hyperthermal Polyatomic Ion Deposition: A New Method for Combinatorial Materials Science," Langmuir, (2001), vol. 17, pp. 5721-5726.
Yergey, Alfred L., et al., "Preparative Scale Mass Spectrometry: A Brief History of the Calutron," American Society for Mass Spectrometry, (1997), vol. 8, pp. 943-953.
Yoshida, Takehito, et al., "Nanometer-Sized Silicon Crystallites Prepared by Excimer Laser Ablation inConstant Pressure Inert Gas," Appl. Phys. Letters, (Mar. 25, 1996, vol. 13, pp. 1772-1774.
Gologan, B., et al., "Ion/surface reactions and ion soft-landing," Phys. Chem. Chem. Phys., (2005), vol. 7, pp. 1490-1500.
Nagaoka, S., et al., "Soft-Landing Isolation of Multidecker v2(benzene)3 Complexes in an Organic Monolayer Matrix: An Infrared Spectroscopy and Thermal Desorption Study," J. Am. Chem. Soc. (2007) vol. 129, pp. 1528-1529.
Yang, X., et al., "Preparative separation of multicomponent peptide mixture by mass spectrometry," J. Mass. Spectum, (2006), vol. 41, pp. 256-262.

* cited by examiner

CONTROLLED DEPOSITION OF METAL AND METAL CLUSTER IONS BY SURFACE FIELD PATTERNING IN SOFT-LANDING DEVICES

CROSS-REFERENCE TO RELATED APPLICATIONS

This patent application is a non-provisional application of U.S. provisional patent application 61/326,431 filed on Apr. 21, 2010 and entitled "Controlled Deposition of Metal and Metal Cluster Ions by Surface Field Patterning in Soft-Landing Devices" which is hereby incorporated by reference in its entirety.

STATEMENT OF FEDERALLY FUNDED RESEARCH

This invention was made with U.S. Government support under Contract No. FA9550-08-1-0153 awarded by the Air Force Office of Scientific Research (AFOSR). The government has certain rights in this invention.

TECHNICAL FIELD OF THE INVENTION

The present invention relates in general to the field of ion deposition, and more particularly to "soft-landing" ions onto a suitable surface for isolation by using a low kinetic-energy ion beam.

REFERENCE TO A SEQUENCE LISTING

None.

BACKGROUND OF THE INVENTION

Without limiting the scope of the invention, its background is described in connection with ion deposition on a surface or a substrate.

U.S. Pat. No. 5,948,703 issued to Shen and Yang, 1999 describes a soft-landing etch process to form an oxide layer with uniform thickness on an open area between flash memory transistors on a substrate. A dielectric oxide layer, such as silicon dioxide, is formed on a semiconductor substrate. A polysilicon layer used to form gates of flash memory transistors is then formed on the oxide layer. The polysilicon layer is covered with a layer of conductive material, such as tungsten silicide (WSi). A cap polysilicon layer is deposited on the conductive layer. An anti-reflecting coating, such as SiON, is formed on the cap polysilicon layer. A photo-resist mask comprising a pattern defining a gate is formed on the surface of the anti-reflecting coating. The soft-landing etch process performed to expose oxide layer on the substrate area between flash memory transistors includes three etch steps. The first etch step is carried out to remove materials covering the gate polysilicon layer on the area between flash memory transistors. Then, the second etch step having high polysilicon-to-oxide selectivity is performed to remove polysilicon covering the oxide layer on the open area. The third etch step is conducted to clean polysilicon residues from the oxide layer surface on the open area.

U.S. Patent Application No. 20090011953 (Cooks et al. 2009) discloses methods and apparatuses that utilize mass spectrometry for preparation of a surface to have catalytic activity through molecular soft-landing of mass selected ions. Mass spectrometry is used to generate combinations of atoms in a particular geometrical arrangement, and ion soft-landing selects this molecular entity or combination of entities and gently deposits the entity or combination intact onto a surface.

U.S. Pat. No. 7,081,617 issued to Mclean et al. 2006 discloses a method and device for the gas-phase separation of ionic biomolecules including peptide, and protein or inorganic cluster ions or nanoparticles by ion mobility and for depositing them intact on a surface in a spatially addressable manner. The surface onto which the proteins are deposited can be modified for the purpose of constructing microarrays of biologically relevant materials or for promoting the growth of highly ordered protein crystals

SUMMARY OF THE INVENTION

The present invention describes a soft-landing (SL) instrument that is capable of depositing ions onto substrates for preparative and developmental research of new materials using a laser ablation source. This instrument of the instant invention was designed with a custom drift tube and a split-ring ion optic for the isolation of selected ions. The drift tube allows for the separation and thermalization of ions formed after laser ablation through collisions with an inert bath gas allowing the ions to be landed at energies below 1 eV onto substrates. The split-ring ion optic directs the ions toward the detector or a landing substrate for selected components.

In one embodiment the present invention discloses a soft-landing (SL) method for depositing or patterning one or more ions, ionized nanoclusters, metal-ligand complexes, polymers, biopolymers or combinations thereof, for liquid crystal formation, for controlled deposition of lubricants into MEMS devices, and for preparing catalytic surfaces comprising the steps of: (i) providing a SL instrument comprising a drift tube and a split-ring ion optic, (ii) ionizing a target, a sample, a composition or a combinations thereof comprising at least one component capable of generating one or more ions by laser ablation in the SL instrument, (iii) separating and thermalizing the one or more ions in the drift tube of the SL instrument by collision with a high pressure inert bath gas or gas mixture contained in the drift tube, (iv) directing the thermalized ions using the split-ring ion optic from the drift tube to a detector or to a landing surface, and (v) soft-landing the ions on the landing surface.

The SL instrument as described in the method of the instant invention comprises: a four-way and reducing cross housing with one or more standard conflate (CF) flanges, a SL chamber housed in the four-way and reducing cross housing wherein the chamber comprises: an opening or a quartz view-port attached to the four-way cross, wherein a laser pulse or a radiation enters the chamber through the opening or the view-port and a linear/rotational feed through line directly opposite the opening or the view-port, wherein the feed through line is inline with the incident radiation or pulse and may optionally be attached directly to the sample, a sample holder or a target, a drift tube comprising: a plurality of steel rings coupled by a series of vacuum resistors, a plurality of thread rods isolated by spacers attached to two outer guard rings, and one or more spacers placed in between the steel rings, wherein the spacers comprise sapphire spheres, two split rings placed at the two ends of the drift tube, wherein the split rings direct an ion cluster beam emanating from the drift tube, a rail system to hold and adjust a detector that monitors the ion beam and collects a drift tube spectra and a landing surface for depositing or patterning the one or more ions, and a quick door (CF) flange to remove or replace the detector, the landing surface, and the sample.

In one aspect of the method disclosed hereinabove the instrument operates at pressures ranging from 1 to 100 Torr. The method of the instant invention further comprising the step of characterizing the prepared surface by one or more physical characterization techniques. selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM). In another aspect the high pressure inert gas comprises helium, argon, nitrogen, and mixtures and combinations thereof, wherein the high pressure gas thermalizes the ions to energies ranging between 0.01 and 1.0 eV. In yet another aspect the landing surface is selected from the group consisting of Fe, Cr, Cu, Si, Mica, Au, $TiO_2$, a diamond surface, Ni, and $BaSO_4$. In specific aspects the surface is a Mica surface and the target is a Copper target.

In another embodiment the instant invention provides a system for depositing or patterning one or more ions, ionized nanoclusters, metal-ligand complexes, polymers, biopolymers or combinations thereof by soft-landing (SL) comprising: (i) a four-way and reducing cross housing with one or more standard conflate (CF) flanges, (ii) a laser source capable of generating a laser pulse or a radiation for an ionization of a target, a sample, a composition or a combination thereof, (iii) a SL chamber housed in the four-way and reducing cross housing wherein the chamber comprises: an opening or a quartz view-port attached to the four-way cross, wherein the laser pulse or the radiation enters the chamber through the opening or the view-port and a linear/rotational feed through line directly opposite the opening or the view-port, wherein the feed through is in line with the incident radiation or pulse and is attached directly to the sample, a sample holder or a target, wherein an electric potential can be optionally applied to the sample or the target supported by a fabricated porcelain or a machineable glass ceramic, (iv) a drift tube for separating and thermalizing the one or more ions by collisions with a high pressure inert bath gas or gas mixture contained in the drift tube, wherein an electric potential can be applied to the drift tube, wherein the drift tube comprises: a plurality of steel rings coupled by a series of vacuum resistors, a plurality of thread rods isolated by spacers attached to two outer guard rings, and one or more spacers placed in between the steel rings, wherein the spacers comprise sapphire spheres, (v) two split rings placed at the two ends of the drift tube, for directing an ion cluster beam emanating from the drift tube, wherein a pulsed voltage can be applied to the split rings, (vi) a high voltage power supply for powering the drift tube, generating an electric field for the migration of the one or more ions, and providing a voltage to a first half of the split rings at one end of the drift tube, wherein the voltage is either a positive voltage or a negative voltage selected depending on a type of ion being analyzed, (vii) a pulsing circuit for providing either a lower positive or a lower negative pulsed voltage in comparison to the drift tube voltage to a second half of split rings at the other end of the drift tube for a specified period of time, wherein the period of time encompasses a desired ion peak, wherein the pulsing circuit comprises: an optocoupler switch activated by one or light emitting diodes (LEDs) and an integrated circuit (IC) metaloxide-semiconductor field effect transistor driver, (viii) a rail system to hold and adjust a detector that comprises a Faraday plate connected to a preamp and an oscilloscope, wherein the detector monitors the ion beam and collects a drift tube spectra and a landing surface for depositing or patterning the one or more ions, (ix) a quick door (CF) flange to remove or replace the detector, the landing surface, and the sample, and (x) a rotary vane rough pump for allowing the system to attain a low pressure in a relatively short time.

The system as described herein further comprises one or more instruments for physical characterization selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM). In one aspect the system operates at pressures ranging from 1 to 100 Torr. In another aspect the high pressure inert gas comprises helium, argon, nitrogen, and mixtures and combinations thereof. In yet another aspect the high pressure gas thermalizes the ions to energies ranging between 0.01 and 1.0 eV.

In one aspect the power supply provides a voltage ranging between 100 and 3000 V. In another aspect the power supply creates an uniform electric field ranging between 5 and 150 V/cm. In yet another aspect the landing surface is selected from the group consisting of Fe, Cr, Cu, Si, Mica, Au, $TiO_2$, a diamond surface, Ni, and $BaSO_4$. In a specific aspect the surface is a Mica surface and the target is a Copper target.

Yet another embodiment of the present invention provides for a soft-landing method for depositing one or more copper ions on a mica surface comprising the steps of: providing a copper target, a copper sample, a copper composition or a combinations thereof comprising at least one component capable of generating one or more copper ions by laser ablation in a SL instrument system, ionizing the copper target by laser ablation in the SL instrument system, separating and thermalizing the one or more ions in the drift tube of the SL instrument system by collision with a high pressure helium gas in a drift tube of the SL instrument system, directing the thermalized ions using a split-ring ion optic from the drift tube to a mica landing surface, and soft-landing the copper ions on the mica surface The SL instrument system as described hereinabove comprises: a four-way and reducing cross housing with one or more standard conflate (CF) flanges, a pulsed Nd:YAG laser 1064 and 532 nm laser source operating at 2 Hz for the ionization of the copper target, a SL chamber housed in the four-way and reducing cross housing wherein the chamber comprises: an opening or a quartz view-port attached to the four-way cross, wherein the laser pulse enters the chamber through the opening or the view-port and a linear/rotational feed through line directly opposite the opening or the view-port, wherein the feed through is in line with the incident radiation or pulse and is attached directly to the copper target, wherein an electric potential can be optionally applied to the copper target supported by a fabricated machineable glass ceramic, a high voltage power source for powering the drift tube and generating an electric field for the movement of the copper ions, wherein the high voltage power source is also used to apply a potential to a first half of the split-ring attached to one end of the drift tube, a drift tube comprising: a plurality of steel rings coupled by a series of vacuum resistors, a plurality of thread rods isolated by spacers attached to two outer guard rings, and one or more sapphire sphere spacers placed in between the steel rings, two split rings placed at the two ends of the drift tube, for directing a copper ion cluster beam emanating from the drift tube, a pulsing circuit for providing a lower negative pulsed voltage in comparison to the drift tube voltage to a second half of split rings at an other end of the drift tube for a specified period of time, wherein the period of time encompasses a desired copper ion peak, wherein the pulsing circuit comprises: an optocoupler switch activated by one or light emitting diodes (LEDs) and an integrated circuit (IC) metaloxide-semiconductor field effect transistor driver, a rail system to hold and adjust a Faraday detector and a mica landing surface in the housing, wherein the Faraday plate detector is connected to a preamp and an oscilloscope, wherein the detector monitors the copper ion beam and collects a drift tube spectra, wherein the mica landing surface is positioned for depositing or patterning the one or more ions, and a quick door (CF) flange to remove or replace the detector, the landing surface, and the sample, and a rotary vane rough pump for allowing the system to attain a low pressure in a relatively short time.

The method as described above further comprises a blanking procedure comprises the step of: providing a mica landing surface, powering on the SL instrument system, with the exception of the laser source, running the SL instrument system for a time period equivalent to the time required to perform the soft landing method of the instant invention, removing the mica landing surface at the end of the time period, and characterizing the mica surface by one or more surface characterization techniques selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM).

The method of the instant invention further comprises the step of characterizing the mica deposited copper surface by one or more physical characterization techniques selected from the group consisting of Secondary Ion Mass Spectrometry (SIMS), X-ray photoelectron spectroscopy (XPS), Atomic Force Microscopy (AFM), X-Ray Diffraction, Optical Interference Measurements (OIM), and scanning electron microscopy (SEM). The method of the instant invention generates one or more $Cu_n^+$ ions, $CuO^+$ ions, $Cu_nO_m^+$ ion clusters, and combinations and modifications thereof.

BRIEF DESCRIPTION OF THE DRAWINGS

For a more complete understanding of the features and advantages of the present invention, reference is now made to the detailed description of the invention along with the accompanying figures and in which:

(FIG. 6A) image of a blank mica surface showing the 001 surface. FIGS. 6B-6D are images of the surface after 3 h of deposition using 1064 nm Nd:YAG. FIG. 6B shows a 3D representation of the surface, with Cu bridging a defect in the lower left corner. The striation pattern can be seen in this image as well. FIG. 6C is a high resolution image of the surface 600 DPI at 0.5 Hz scan shows the striation pattern of the surface. FIG. 6D shows striations on the surface after landing and a defect on the surface that was not filled in during deposition emphasizing a low deposition energy of 1 eV.

DETAILED DESCRIPTION OF THE INVENTION

Figure 1A:
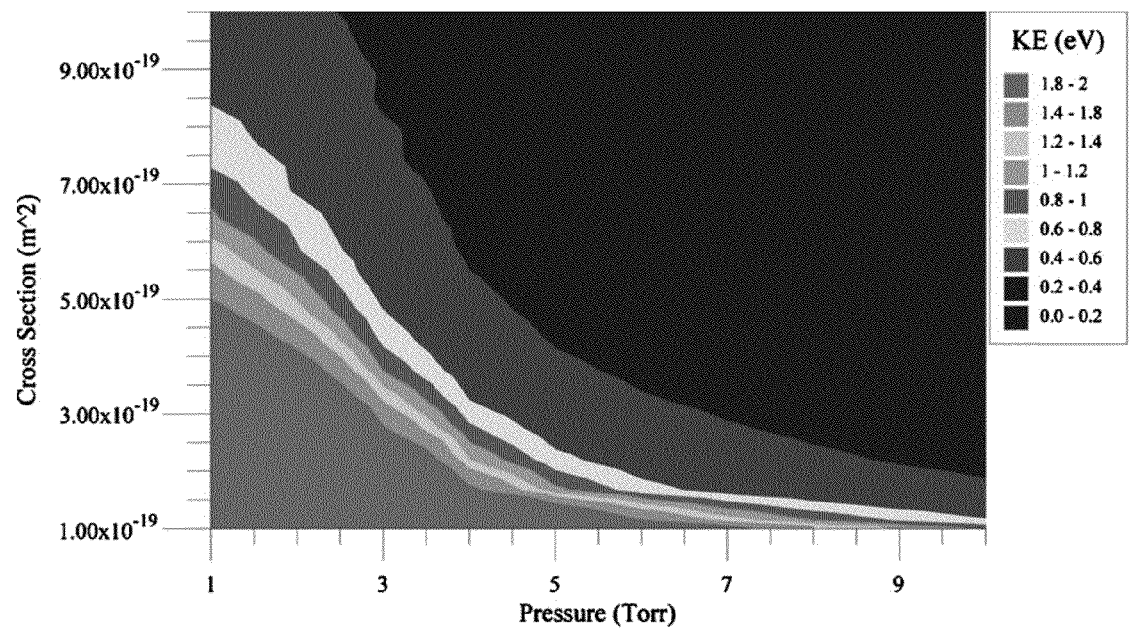
FIGS. 1A and 1B show KE contour plot graphs based on calculations from Eq. 3 by using study parameters and by varying collisional cross section ($m^2$) vs pressure (E=9.0 V/cm) (FIG. 1A) and electric field (V/cm) vs pressure ($\Omega=3.55\times10^{-19}\,m^2$)

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "soft-landing" in its broadest sense usually refers to and is used herein to refer to, non-destructive capture of a gas-phase ion on a target, such that it can be retrieved from the vacuum system of the mass spectrometer and identified or otherwise analyzed or used.

As used herein the term "ion" refers to an atom or molecule in which the total number of electrons is not equal to the total number of protons, giving it a net positive or negative electrical charge.

The term "flange" as used herein is generally understood as a separable connecting element and is defined in The American Heritage Dictionary, Second College Edition, 1991, as "a protruding rim, edge, rib or collar", as on a wheel or a pipe shaft, used to strengthen an object, hold it in place, or attach it to another object.

The term "X-ray diffraction" (XRD) refers to the reflection of definite and characteristic angles from space lattices of crystal of X-rays which have been caused to bombard them, thus giving data for identification of characteristics lattice structure of a given species of material. The X-ray diffraction technique is well known to those skilled in the art. See, e.g., pages 652-658 of Volume 14 of the McGraw-Hill Encyclopedia of Science & Technology (McGraw-Hill Book Company, New York, 1977).

The present invention describes the application and design of an instrument for Soft-landing mass spectrometry for deposition and patterning of metal and metal cluster ions onto a suitable surface for isolation. The present inventors pattern these ions on the surface using a very controlled ion beam from a 1000 eV to 0.001 eV ion beam produced from an ion selection device (i.e. Drift Tube, Quadrupole Mass Spectometer, Time-of-Flight Analyzer, and Sector Devices). Because of the low kinetic energy of the ion beam, it is possible to introduce a small field at the landing surface to help control ion deposition. By patterning conductive electrodes in an insulator, and applying small voltages (1 uV to 1 kV), penetrating fields come through the insulative or semi-insulative landing surface to steer the incoming ion beam. Circular, linear, single-point, electrodes can all create a desired landing pattern. The present invention can be used to pattern any ion onto a surface. This could be used in semiconductor, new electronic devices, liquid crystal formation or controlled deposition of lubricants into MEMS devices.

The invention further discloses the design and fabrication of a drift tube SL instrument that is unique from mass spectrometer SL instruments in that it operates at pressures ranging from 1 to 100 Torr rather than the usual high vacuum conditions. The instrument of the instant invention is capable of specifically selecting and soft landing a cluster of a particular mobility that would greatly reduce the time it takes to characterize a specific cluster system from current traditional deposition methods and allow for the characterization of separated ions within the drift tube. Also, with the increases in pressure, a list of more suitable substrates could be attained.

The concept of producing and controlling structures on an unprecedented small scale was proposed by Richard Feynman at the annual meeting of the American Physical Society in 1959. Since that time research and development has revealed that nanoscale structures can have novel optical, magnetic, electronic, and mechanical properties. Indeed, significant changes in chemical reactivities have been observed when adding only a single atom to a certain cluster size. However, such studies are still rare mainly because of the lack of suitable instrumentation and methodology. Further understanding and exploitation of the physical and chemical properties of nanometer-scale structures would benefit greatly from the capacity to tailor their synthesis in a well-controlled manner. Such capability requires the development of methodologies for synthesis and separation of monodisperse nanoconstructs of desired composition and size, management of their delivery to well-defined substrates, and preservation of their structure and functionality subsequent to deposition. Unprecedented flexibility in fabrication of novel nanostructures would result from such a capability.

Mass spectrometry (MS), a technique traditionally used for mass determination and structural characterization, is inherently suited for use in nanoscale research. That is, it is more generally a gas-phase chemical laboratory enabling the sorting, manipulation, and reaction of charged gas-phase species via their mass-to-charge ratio, with isotopic specificity, from elemental to molecular to macromolecular constructs of thousands of atoms. For example, although after MS separation the purified ionic materials normally are lost during the detection process, it is instead possible to collect them intact. The collection of mass-separated isotopes of uranium ions following collisions with surfaces is well known from operations carried out at Oak Ridge during the Manhattan project.[1] Mass-isolated metal cluster ions have been deposited on magnesium oxide to prepare specific catalysts, and the exact sizes of Au, Pd, and Ni clusters that produce the highest catalytic activity for CO oxidation were determined.[2] More recently, preparative methods and instrumentation have been developed that enable measurable quantities of mass-selected, gas-phase organic and protein ions to be recaptured in the condensed-phase.[3] In these examples, it is important to note that the desired species were not formed by reaction in the mass spectrometer, but were simply introduced into the instrument as part of a complex mixture of similar components. That is, MS was used only as a means for separation and subsequent collection of monodisperse nanostructures from the heterogeneous population of preformed clusters. Conversely, the capabilities of MS for scaled cluster synthesis via gas-phase ion processes have been exploited as well. For example, using ion/molecule reactions (scaling-up) followed by collision-induced dissociation (scaling-down), small heterodimer metal clusters have been assembled in the gas phase.[4] Of considerable potential as well, ion/ion reactions of mass-selected precursors have been demonstrated for generation of large, multi-unit molecular systems. In both instances, however, the mass spectrometer served only as a confining device for investigation of the synthesis, reactivity, and characteristics of gas-phase ions.

Given the above, the concept of using the capabilities of mass spectrometry to form a comprehensive strategy for nanofabrication appears to have enormous potential for nanoscience. The present invention disclose a novel strategy for nanofabrication: the use of MS for tailored molecular-level synthesis of gas-phase building blocks via a step-by-step "bottom-up" approach combined with the capacity for mass-selective segregation and deposition of condensed-phase, monodisperse nanostructures. Knowledge and insight gained from the studies of the present invention can be used to determine in which situations the identity of resultant monodisperse clusters can be controlled, optimized, and exploited to manage synthetic outcomes for nanoscale structures. At the same time, the advanced instrumentation described herein will afford nanoscience the capability of providing new types of fundamental information, thus benefiting the general scientific community.

The soft-landing (SL) of ionized nanoclusters, metal-ligand complexes,[5] polymers,[6] and biopolymers[7] intact on a hard surface is not a trivial task, but not novel either, in the sense that it was developed over a quarter century ago.[8] SL is used for the isolation, purification, and characterization of ionized compounds (proteins, catalyst, clusters, etc.), and research in this area has become more active within the past decade.[9-11] SL instruments typically utilize mass spectrometers to isolate and land compounds with quadrupoles,[11,12] rectilinear ion traps,[10] sectors,[13] and ion cyclotron resonance.[14,15] The amount of kinetic energy (KE) (10-100 eV) used to land ions in current instrumentation can be high in order to study the self assembly of ions on certain substrates, as the translational energy associated with this KE would allow the ions to move around and aggregate on the substrate surface. The design and fabrication of the drift tube SL instrument as described herein is unique from mass spectrometer SL instruments in that it operates at pressures ranging from 1 to 100 Torr rather than the usual high vacuum conditions. High pressure gas within the drift tube thermalizes the ions to between 0.01 and 1.0 eV, allowing further characterization of deposited materials. The ability of the instrument to specifically select and soft land a cluster of a particular mobility would greatly reduce the time it takes to characterize a specific cluster system from current traditional deposition methods and allow for the characterization of separated ions within the drift tube. Also, with the increase in pressure, a list of more suitable substrates could be attained.

The operating principle of the SL instrument described herein is the narrowing of the KE distribution of the ions traveling through a drift tube filled with a neutral buffer gas. The conditions at which the drift tube operates are important parameters to consider during a SL experiment as changes in pressure (P), temperature (T), field strength (E), and ion's collisional cross section with a buffer gas ($\Omega$) affect its mobility within the drift tube. Separation is based on probing the differences in ion migration. The mobility of the ion (K) can be calculated [Eq. 1], with (m) ion mass, (M) mass of the buffer gas, (z) charge of the ion, (e) elementary charge, (kb) Boltzmann's constant, (T) buffer gas temperature, (N) number density of the gas inside the instrument, and (E0) field strength. The average KE is calculated using classical mechanics assuming the internal temperature of the ion is the same as the buffer gas and that interactions between the ion and neutral molecules are negligible. In order to determine SL energy of the ion,[16-18]

$$K = \frac{3}{16}\frac{ze}{N}\left(\frac{1}{m} + \frac{1}{M}\right)^{1/2}\left(\frac{2\pi}{k_b T}\right)^{1/2}\frac{1}{\Omega}, \quad (1)$$

$$v_d = \frac{L}{t_d} = KE_0. \quad (2)$$

The KE of the ion within the drift tube is calculated by substituting the velocity in the KE equation with mobility. The value of the energy of the ion can be determined from [Eq. 3].

$$K_E = \frac{18\pi z^2 e^2 R^2}{512 k_b N_A} \times \frac{E^2 T}{P^2 \Omega^2} \times \left(1 + \frac{m}{M}\right). \quad (3)$$

Figure 1B:
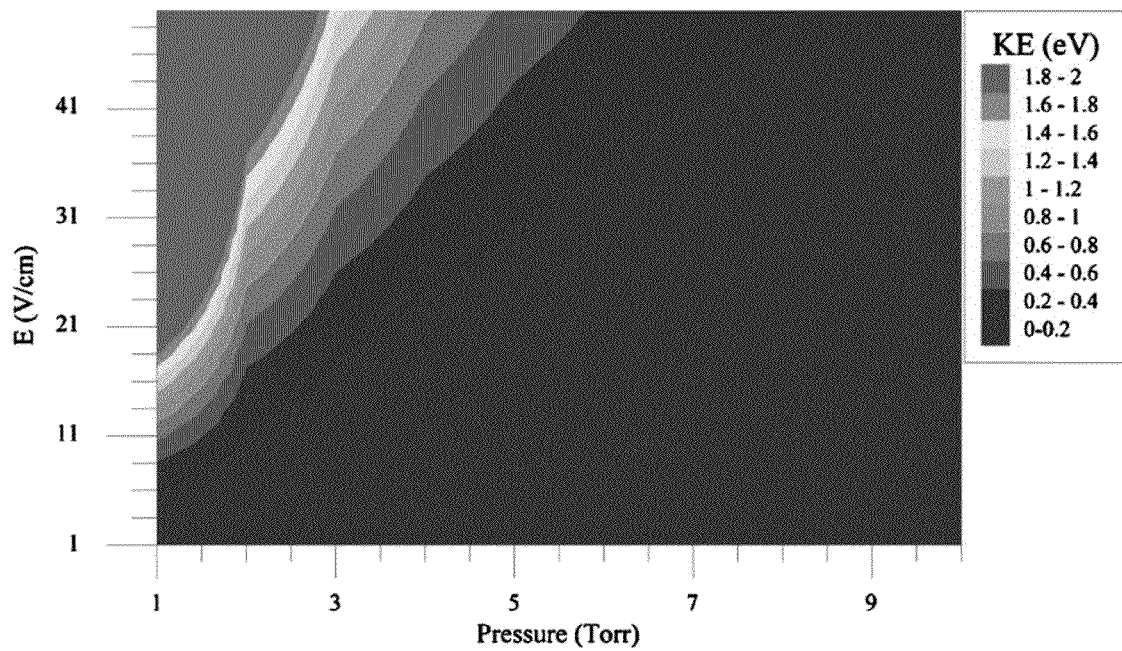

This relation allows the calculation of the KE of the ion based on the operational parameters of the study. The contour plots in FIGS. 1A and 1B show the decrease in KE as a function of the cross section and pressure while KE increases as a function of temperature and field. This trend is expected [Eq. 3] as the temperature and field terms are proportional to the energy of the ion while the pressure and cross-section terms are inversely proportional. Based on these plots, the operator can set the parameters of the drift tube to create the sub-eV landing conditions of the ions onto the substrate. Topics such as diffusional broadening of the ion packet in the x, y plane, high-field and low-field mobility, resolution based on the high and low field mobility, and an in depth description of theory and calculations have been previously described.[16, 19-25]

Figure 2:
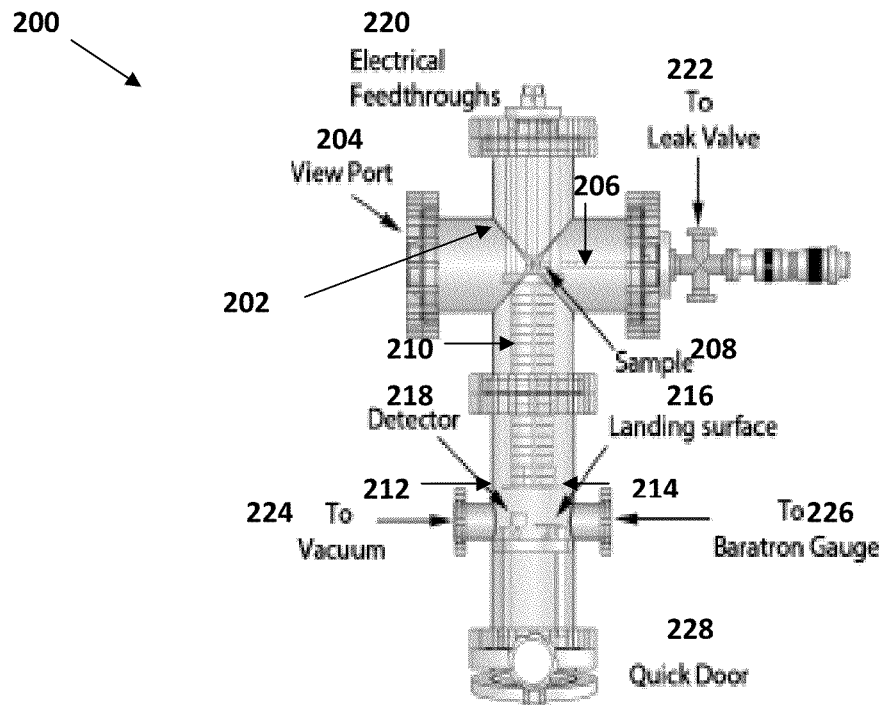
FIG. 2 is a schematic CAD of the SL instrument.

Instrument Design: A multitude of commercially available and customized components have been utilized in the design and construction of the instrument of the present invention. FIG. 2 depicts the SL chamber 200 and a number of its components, which are housed in a four-way and a reducing cross 202 along with standard conflat (CF) flanges (MDC Vacuum, Hayward, Calif.). This SL instrument 200 utilizes laser ablation, drift tube separation, and a Faraday plate as detector. The laser ablation and cluster formation is explained in greater detail in a different section of the disclosure. A pulsed Nd:YAG (Minilite, Continuum, Santa Clara, Calif.) beam enters the chamber via a quartz viewport 204 attached to the four-way cross 202. Directly opposite the viewport 204 is a linear/rotational feedthrough in line 206 with the incident radiation. The sample 208 is attached directly to the feedthrough 206 but is isolated from ground by a 0.25 in. diameter, 6 in. long piece of Macor® (Corning, Corning, N.Y.). A metal sample, or sample of the users choosing, is placed 0.25 in. from and at an angle of 55° relative to the entrance of the drift tube 210. The advantages of this sample system are that multiple sample sizes and shapes can be accommodated to fit within the chamber, along with the possibility of applying an electric potential to these samples during ablation. The drift tube 210 is comprised of 20 stainless steel rings 2 in. outer diameter 1.25 in. inner diameter resistively coupled together by a series of 5 MΩ vacuum resistors (Caddock Electronics, Riverside, Calif.), and compressed by three pieces of all thread rods isolated by alumina spacers through two outer guard rings. A spacing of 0.05 in. is created between each ring by sapphire spheres. The drift tube 210 has a unique design of 18 concentric rings accompanied by two split rings 212 and 214. The two split rings are placed at the end of drift tube 210 and direct the ion cluster beam either to the landing surface 216 or to the detector 218. A pair of high voltage power supplies (PS300/PS350, Stanford Research System, Sunnyvale, Calif.) provide a voltage between 100 and 3000 V (either positive or negative depending on the type of ion that is to be analyzed) that is applied to the drift tube 210, creating a uniform field between 5 and 150 V/cm and is defined by Eq. (1).[26] The ion optic split-ring assembly at the end of the drift tube has a potential that is in line with that of the drift tube; where the other halves of the two rings are pulsed down to a lower voltage either negative or positive for a set time period corresponding to a peak based on the drift tube spectra.[27] This gating allows us to select the specific size cluster and deposit it on our substrate. The gating task is accomplished through a home built pulsing circuit, which will pulse down the voltage on one side of the split rings causing the ions to be directed toward the higher potential side of the rings moving the ions toward the landing surface 216 and away from the detector 218.

Figure 3:
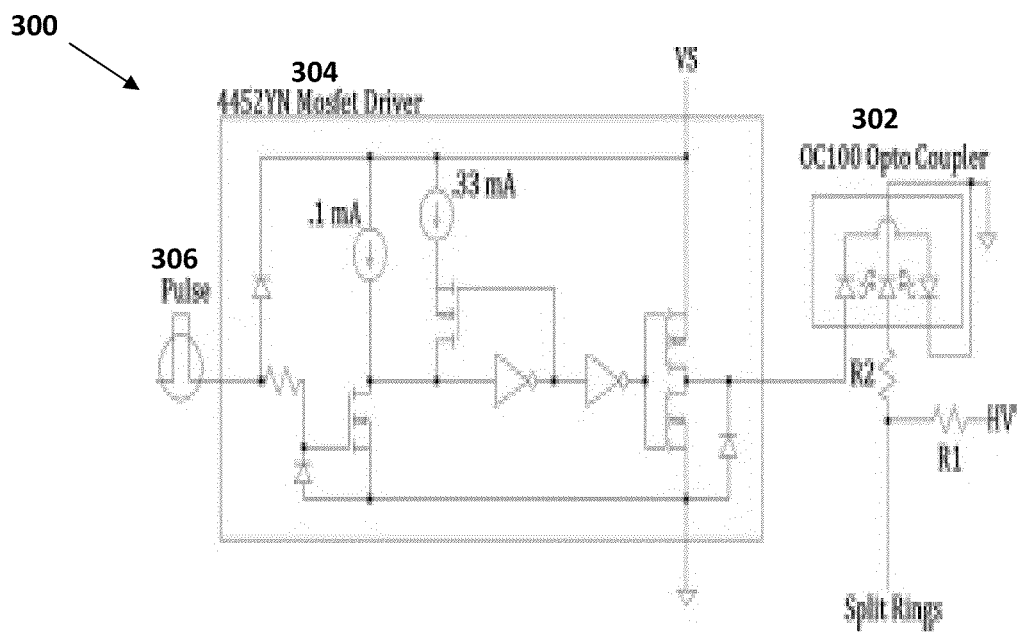
FIG. 3 is a circuit schematic of the split ring pulsing circuit. The OC100 optocoupler is an optical switch (Voltage Multiplier, Inc.) that when pulsed closes the photodiode and allows the circuit to be completed. The 4452YN IC Driver (Micrel, Inc.) boosts the pulse's current to enough to drive the optocoupler completing the voltage divider for the pulse down.

The circuit schematic is given in FIG. 3, which shows the pulsing circuit 300 and its components that utilizes an optocoupler, (OC100, Voltage Multiplier Inc., Visalia, Calif.) 302 and an Integrated Circuit (IC) metaloxide-semiconductor field effect transistor driver (4452YN, Micrel Inc., San Jose, Calif.) 304. The optocoupler 302 is a switch that operates when the light emitting diodes are activated by the pulse 306. This pulse 306 opens the switch to ground and divides the voltage creating a pulse down effect. The drift tube 210 is mounted to a 6 in. CF zero-length reducing flange by two pieces of 0.5 in. stainless steel hexagonal stock held in place with cap head screws. Collisions with the buffer gas thermalize the ions and separate the clusters formed via the laser ablation, based on their collisional cross sections. He gas is introduced through a leak valve 222 and the instrument 200 operates at a pressure between 1 and 100 Torr. Various buffer gases ($H_2$, Ar, and $N_2$) may be used in the drift tube studies. A custom rail system, along with a quick door CF flange, is incorporated into the instrument 200 as a means to hold, adjust, and remove the landing surface 216 and detectors 218 without having to disassemble the instrument 200, reducing the number of gaskets used. The SL detector deployed in the instrument 200 is a simple Faraday plate 218 connected to a preamp (SR570, Stanford Research Systems, Sunnyvale, Calif.) and then to an oscilloscope (TDS3034B, Tektronix, Beaverton, Oreg.) to monitor the ion beam and collect the drift tube spectra. The detector was chosen for its ease of construction, operability, and robustness in low vacuum applications. Landing surfaces were chosen based on their relative flatness. Ideally a 001 surface is preferred, but a wide array of surfaces may be used. A 15 mm [atomic force microscopy (AFM)] grade V-1 Muscovite mica disk (SPI Supplies, West Chester, Pa.) was employed the landing surface by the present inventors. This instrument 200 is capable of handling various modified landing surfaces 216 and sizes by simply changing the sample mount through the quick door 228. An accompanying 8.2 cubic feet per minute (cfm) rotary vane rough pump (DS 302, Varian, Palo Alto, Calif.) allows the instrument to reach the low millitorr region (4-8 mTorr) in a relatively short time (less than 10 min).

Experimental Method: Data obtained using the drift tube SL instrument 200 of the present invention consists of the laser ablation of a Cu target by a pulsed Nd:YAG 1064 and 532 nm laser operating at 2 Hz. A buffer gas (99.999% He) is introduced into the chamber via a variable leak valve 222 until a pressure of 8 Torr is achieved (measurement of pressure is done with a baratron pressure gauge, MKS, Andover, Mass.). A high voltage variable power supply set to (200 V dc) is used to power the drift tube 210 and create the required field for ion travel through the drift tube 210. Amplification and detection of the Faraday plate detector 218 signal is accomplished via a preamp and an oscilloscope averaging the signal over 16 intervals to obtain the spectra. Cluster isolation and selectivity is done through the pulsing of the split rings 214 and 214 at the end of the drift tube 210. A higher voltage between −250 and −238 V (−238 V used during studies) is applied to the other half of the split rings during this time. Then the split rings are pulsed down to −80 V using the home built pulsing circuit for a duration that encompasses the desired peak. During this pulse, the ions drift toward the stronger field and land on the surface. The landing surface 216 utilized for these studies was an AFM grade V-1 muscovite mica surface characterized by x-ray diffraction (XRD) (not shown) and chosen due to its preferred orientation in the 001 direction. The mica surface is cleaved and positioned 0.125 in. away from the end of the drift tube 210. A metal plate biased at −250V behind the sample keeps the ions moving toward the landing surface 216. Characterization of the instrument 200 was developed through a series of studies which had the instrument 200 operating for a period of 1-3 h in 1 h intervals allowing the laser to cool for a 30 min period before resuming operation. The study begins by taking an initial blank of a freshly cleaved mica surface and placing it into the instrument. All study parameters are set to the values mentioned above and turned on, except for the laser. The purpose of this blanking procedure is to ensure that the mica surface is smooth and that no foreign objects or deposition is taking place due to the instrument or pump oil being introduced back into the instrument. The blank time is set for the same amount as the actual SL run (3 h). The sample is then removed via the quick door 228 for characterization via AFM to ensure that nothing has been deposited on the surface 216 and that it is relatively smooth from the cleaving process. After AFM confirmation of the surface 216 has been completed, the inventors then proceed to place the surface back into the chamber and repeat the above mentioned steps this time with the laser activated and aligned to the target surface. After the study is complete, the sample 216 is removed for characterization using AFM.

Figure 4:
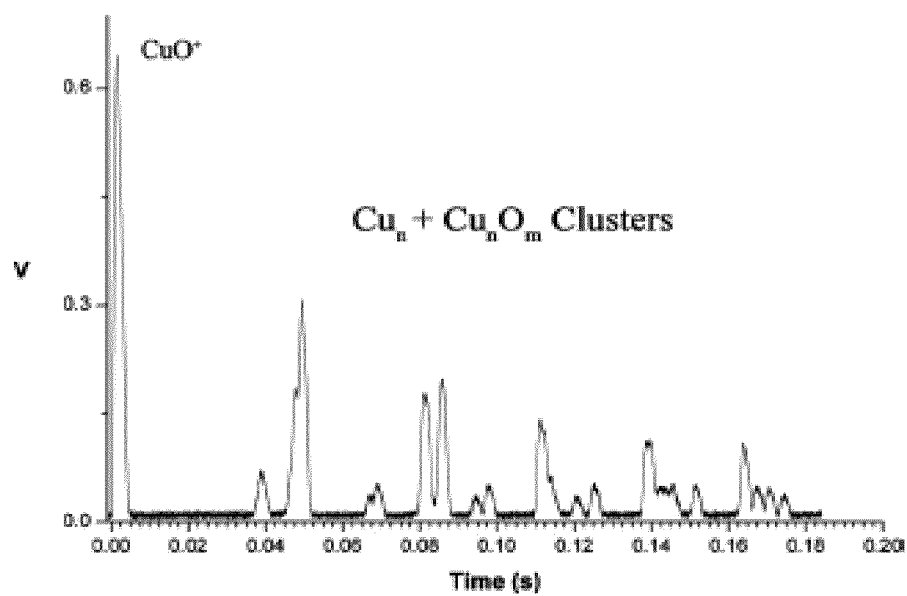
FIG. 4 shows the drift tube spectra of laser ablated Cu with a 1064 nm Nd:YAG at a pressure of 8 Torr. Peak assignments correspond to $CuO^+$ with the remaining $Cu_n$, $Cu_nO_n$ clusters corresponding to stable magic number (n=13, 55, 75, ...) clusters.

Results: A. Identification of peaks: The laser ablation of the Cu target at 8 Torr of He gas exhibits a spectrum (FIG. 4) that contains multiple peaks (22 counted in the spectra). Calculations for cross sections, mobilities, and reduced mobilities were carried out for the corresponding $Cu_n+$ and $Cu_nO_m+$ clusters along with their respective isomers. The current theory for the formation of $Cu_nO_m$ clusters is the presence of surface oxides within the drift tube, due to oxygen contamination of metal and the chamber. Similar $O_2$ contamination was observed in previous Cu cluster work at high vacuum conditions.[28,29] The first peak of the spectra corresponds to CuO+ based on drift velocity (vd) and mobility (K) the reduced mobility was calculated to be 15.56 $cm^2 V^{-1} s^{-1}$. The reduced mobility of Cu+ given by Kemper/Bowers is 15.7 $cm^2 V^{-1} s^{-1}$ and was used as the basis to ensure the calculations for CuO+ were within a reasonable value.[30] The reduced mobility of CuO+ is expected to be less than that of Cu+ due to the larger cross section of the ion. Based on calculations of the first peak, the remaining peaks in FIG. 4 correspond to magic number stable structures (n=13, 38, 55, 75, . . . ) and their isomers.[31-34] Formation of these large nanoclusters is due in part to the laser ablation of metal in the presence of an inert gas. When ablation occurs in an inert atmosphere, cluster size becomes dictated by the pressure at which the event occurs.[35,36] Previous studies based on this pressure dependence have shown that at low pressure (1 Torr) smaller sized clusters tend to be dominant, but as the pressure increases larger sized clusters begin to form within the ion plume.[35-37] A time of flight mass spectrometer is currently in development, which would allow for high resolution identification each cluster structure.

Figure 5:
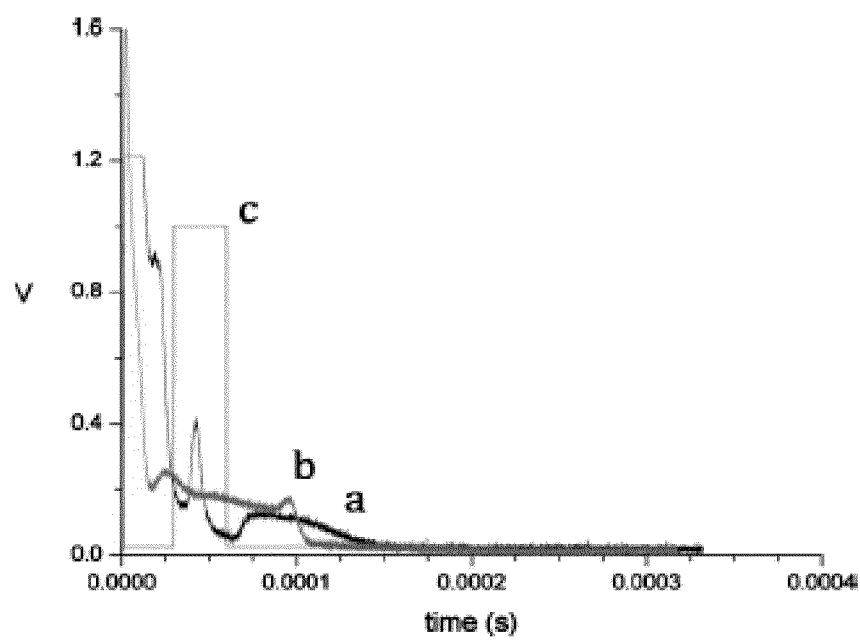
FIG. 5 shows the overlaid spectra of split-ring operation. (a) spectra of Cu clusters with split-ring voltage uniform with that of the drift tube (−240 V), (b) spectra with split-ring pulsed down to (−80 V) the spectra changes and peak 3 drops out of the spectra for the duration of the pulse, (c) square pulse.

B. Cluster isolation using split rings: Isolation of a specific cluster is accomplished using the split rings and a custom built circuit (FIG. 3) to obtain the spectrum in FIG. 5. The split ring is pulsed and the spectrum of $Cu_n$ (n=1-4) changes as $Cu_3$ moves away from the detector. The $Cu_3$ peak is dropped out using a pulse delay generator timed for the selected cluster. FIG. 5 shows the overlaid spectra, which consist of the square wave pulse, unpulsed complete spectrum, and the pulsed spectrum minus the selected peak. The split ring ion optic device at the end of the drift tube gives us a dynamic range to select clusters with a limitation based only on the electronic's slew rate.

Figure 6A:
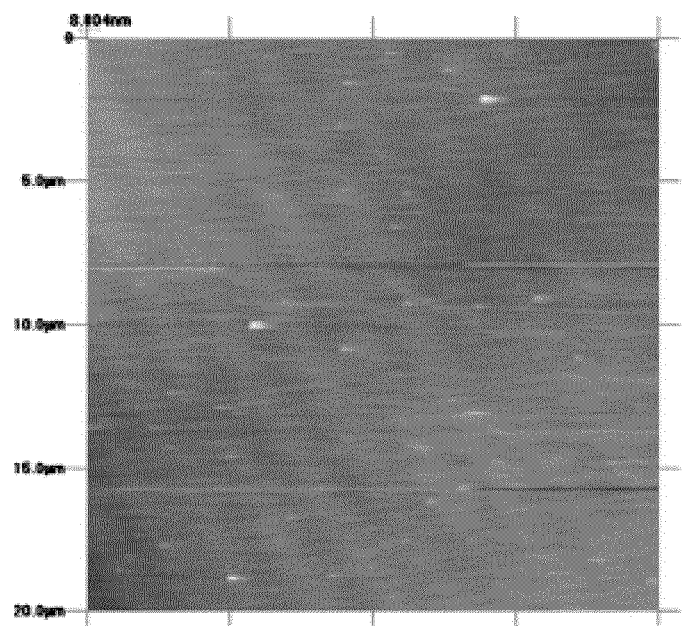
FIGS. 6A-6D show the AFM images of the muscovite mica surface.
Figure 6B:
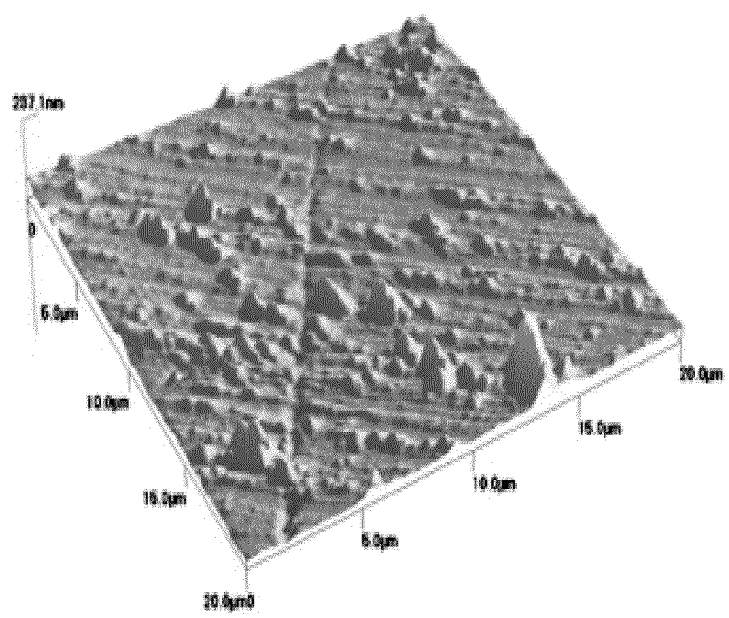
Figure 6C:
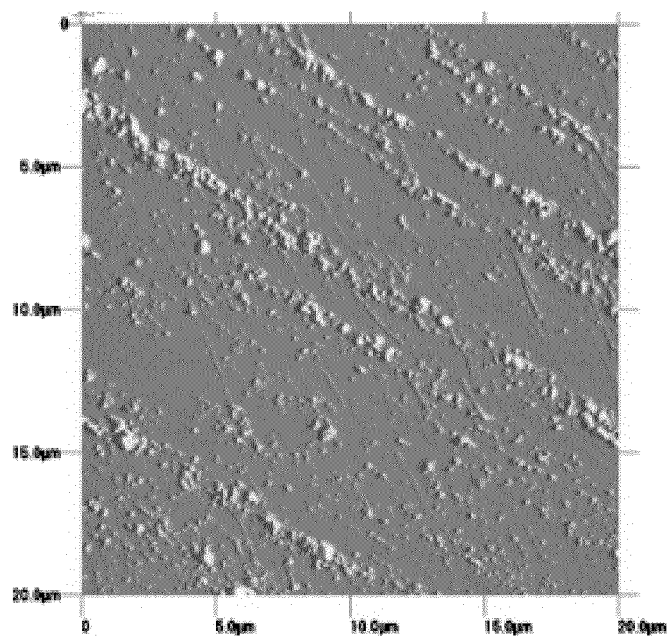
Figure 6D:
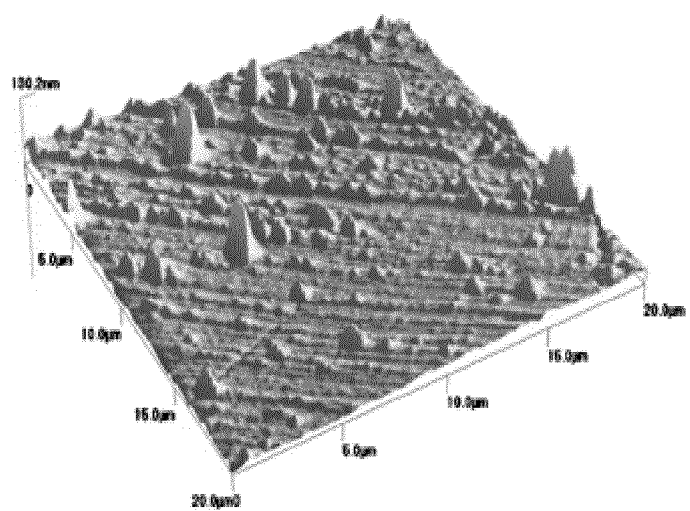
Figure 7A:
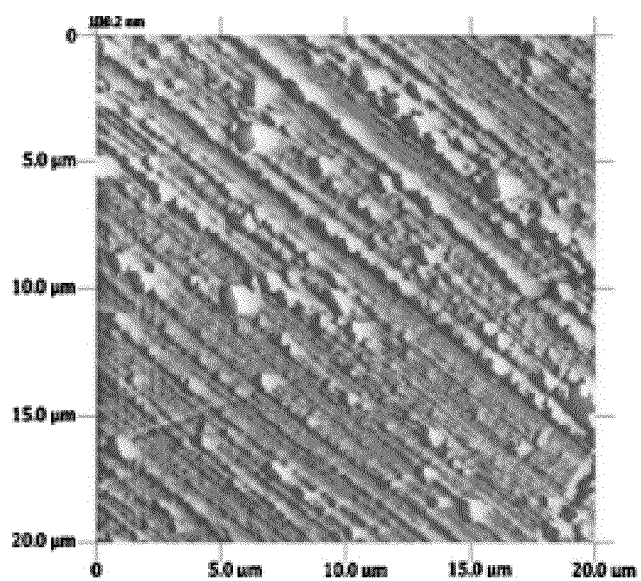
FIGS. 7A and 7B are images showing the SL vs PVD comparison. The SL deposited surface (FIG. 7A) shows surface buildup in striation/columnar fashion; and the PVD surface (FIG. 7B) shows a uniform deposition taking place instead of an alignment in one direction like SL.
Figure 7B:
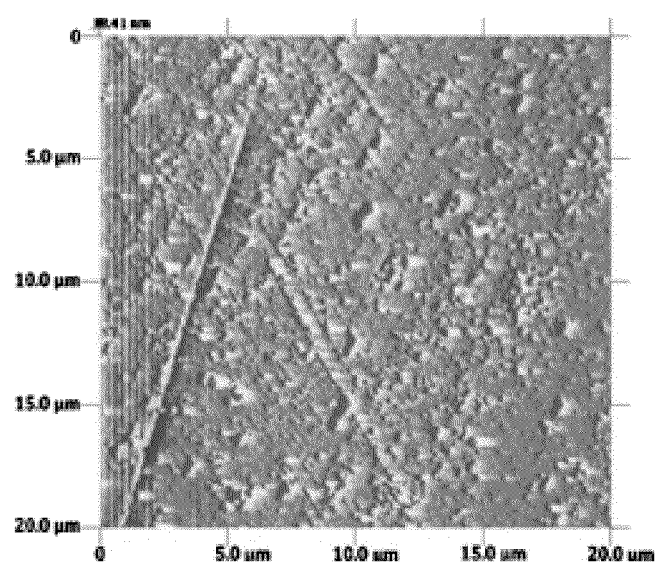

AFM characterization of Cu deposition: AFM characterization of soft-landed surfaces is used to validate the presence of deposited clusters and/or self assembly on the landing surface. AFM images 20×20 $\mu m^2$ were taken with a Quesant Q-Scope (Ambios Technology, Santa Cruz, Calif.) operating in wave mode with a Si cantilever. FIG. 6 is comprised of a set of four AFM images a blank FIG. 6A and three (FIGS. 6B, 6C, and 6D) of the soft-landed surface. Upon landing on the surface, any charge the ion has will migrate to the surface in an attempt to become stable. Since the landing energy is sub-eV once on the surface the ions have little mobility along the surface and will tend to deposit in bands of conductivity along the mica surface due to K, Fe or Mg present within the lattice, but the exact composition of the conductivity band depends on the mica's origin (mica varies from source to source). After the initial landing on the surface, subsequent ions will land on previously landed Cu allowing the ions to migrate their charge more readily through Cu than it is for the ion to find a new spot to land on the surface of the mica. AFM images (FIG. 6C) of the landing surface show a heteroepitaxial growth in a columnar/striation fashion from soft landing clusters on the surface. The blank mica AFM image in FIG. 6A exhibits the 001 surface previously characterized by XRD meaning the deposition and assembly of the Cu in columnar fashion is due to the SL on the surface. Another factor may be chemical. Since we are at low vacuum, the surface of the mica may have absorbed water on the surface from the atmosphere after cleaving, which may contribute to the deposition as well.[38,39] The images in FIGS. 6B and 6D show the bridging of a defect on the surface of the mica. In the lower left corner of the image, we see the Cu clusters actually bridge across the defect and not fill in the defect as one would observe with energetic deposition such as physical vapor deposition (PVD) and chemical vapor deposition. The tendency with high energy species (ions and molecules) is for them to be deposited on the surface, move around finding and filling in the defects causing a uniform heteroepitaxial growth to occur as all the defects are continuously filled in. In contrast, SL with its low energy deposition (<1 eV), will experience growth and assembly in a columnar fashion as the ions, once deposited, do not have the energy necessary to be mobile along the surface. A comparison and verification of the soft-landed deposition is required to ensure that SL is different from that of PVD. A freshly cleaved muscovite surface was taken and placed in a deposition chamber and pumped out to a pressure of $4\times10^{-6}$ Torr, with a piece of 99.99% pure oxygen free Cu that is to be deposited. The deposition duration was timed for a period of 25 s with a thickness monitor reporting a deposition of 2.3 nm on the surface. AFM images were taken of the surface for a comparison between PVD and SL (FIGS. 7A and 7B). FIG. 7A shows the SL surface while the FIG. 7B shows the PVD surface. The PVD surface image shows a uniform deposition has taken place and begins to form across the surface, and a cross hatch pattern is seen along the surface as well. Comparing the two images, the alignment and direction of the Cu columns from SL become more apparent, justifying the soft-landed deposition is different from that of PVD. Though the SL deposition of Cu onto the mica substrate has been shown, the exact mechanism of deposition and assembly of the surface is not yet understood. The unique columns and growth may lead to the growth of nanowires for use in microelectromechanical systems.

The present invention describes the design and implementation of a drift tube SL. The characterization of soft-landed metal ion clusters using laser ablation in the presence of He has been tested herein and shown as viable source for the preparative production of a metal ion clusters. The outfitting of this instrument with different types of ionization sources will allow it to be a versatile SL instrument ranging from the SL of biomaterials, to the formation of new or rare materials for isolation and characterization. The present inventors have shown that drift tube SL is a novel technique for the SL of ions. The emergence of new high pressure ion optic components and higher resolution drift tubes will allow us greater control and separation of the ion beam for SL purposes.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

U.S. Pat. No. 5,948,703: Method of Soft-Landing Gate Etching to Prevent Gate Oxide Damage.

U.S. Patent Application No. 20090011953: Methods and Apparatuses for Preparing A Surface to Have Catalytic Activity.

U.S. Pat. No. 7,081,617: Gas-Phase Purification of Biomolecules by Ion Mobility for Patterning Microarrays and Protein Crystal Growth.

[1](a) Smith, L. P; Parkins, W. E.; Forrester, A. T. Phys. Rev 11 (1947) 989. (b) Love, L. O. Science 182 (1973) 343. (c) Yergey, A. L., Yergey, A. K. J. Am. Soc. Mass Spetrom. 8 (1997) 943.

[2]Abbet, S.; Judai, K.; Klinger, L.; Heiz, U. Pure Appl. Chem. 74 (2002) 1527.

[3](a) Cooks, R. G; Jo, S. C.; Green, J. App. Surf. Sci. 231-232 (2004) 13. (b). Ouyang, Z.; Takats, Z.; Blake, T. A.; Gologan, B.; Guyman, A. J.; Wiseman, J. M.; Oliver, J. C.; Davisson, V. J.; Cooks, R. G. Science 301 (2003) 1351. (c). Blake, T. A.; Ouyang, Z.; Wiseman, J. M.; Takats, Z.; Guymon, A. J.; Kothari, S.; Cooks, R. G. Anal. Chem. 76 (2004) 6293. (d) Volny, M.; Elam, W. T.; Branca, A; Ratner, B. D.; Turecek, F. Anal. Chem. 77 (2005) 4890. (e) Mayer, P. S.; Turecek, F.; Lee, H. N.; Scheidemann, A. A.; Olney, T. N.; Schumacher, F.; Strop, P.; Smrcina, M; Patek, M; Schirlin, D. Anal. Chem. 77 (2005) 4378.

[4]Jacobson, D. B.; Freiser, B. S. J. Am. Chem. Soc. 106 (1984) 4623.

[5]S. Nagaoka, T. Matsumoto, K. Ikemoto, M. Mitsui, and A. Nakajima, J. Am. Chem. Soc. 129, 1528 (2007).

[6]M. B. J. Wijesundara, E. Fuoco, and L. Hanley, Langmuir 17, 5721 (2001).

[7]X. Yang, P. S. Mayer, and F. Ture, J. Mass Spectrom. 41, 256 (2006).

[8] V. Franchetti, B. H. Solka, W. E. Baitinger, J. W. Amy, and R. G. Cooks, Int. J. Mass Spectrom. Ion Phys. 23, 29 (1977).
[9] L. Hanley and S. B. Sinnott, Surf. Sci. 500, 500 (2002).
[10] W.- P. Peng, M. P. Goodwin, Z. Nie, M. Volny, Z. Ouyang, and R. G. Cooks, Anal. Chem. 80, 6640 (2008).
[11] O. Hadjar, P. Wang, J. H. Futrell, Y. Dessiaterik, Z. Zhu, J. P. Cowin, M. J. Iedema, and J. Laskin, Anal. Chem. 79, 6566 (2007).
[12] B. Gologan, J. R. Green, J. Alvarez, J. Laskin, and R. G. Cooks, Phys. Chem. Chem. Phys. 7, 1490 (2005).
[13] P. S. Mayer, F. Turecek, H.- N. Lee, A. A. Scheidemann, T. N. Olney, F. Schumacher, P. Strop, M. Smrcina, M. Patek, and D. Schirlin, Anal. Chem. 77, 4378 (2005).
[14] J. Alvarez, R. G. Cooks, S. E. Barlow, D. J. Gaspar, J. H. Futrell, and J. Laskin, Anal. Chem. 77, 3452 (2005).
[15] J. Laskin, E. V. Denisov, A. K. Shukla, S. E. Barlow, and J. H. Futrell, Anal. Chem. 74, 3255 (2002).
[16] E. W. McDaniel and J. T. Moseley, Phys. Rev. A 3, 1040 (1971).
[17] E. A. Mason and E. W. McDaniel, Transport Properties of Ions in Gases (Wiley, New York, 1988).
[18] H. E. Revercomb and E. A. Mason, Anal. Chem. 47, 970 (1975).
[19] G. H. Wannier, Bell Syst. Tech. J. 32, 85 (1953).
[20] G. A. Eiceman and Z. Karpas, Ion Mobility Spectrometry, 2nd ed. (Taylor and Francis, Boca Raton, 2005).
[21] S. Rokushika, H. Hatano, M. A. Baim, and H. H. Hill, Anal. Chem. 57, 1902 (1985).
[22] G. R. Asbury and H. H. Hill, Jr., J. Microcolumn Sep. 12, 172 (2000).
[23] P. Watts and A. Wilders, Int. J. Mass Spectrom. Ion Process. 112, 179 (1992).
[24] G. F. Verbeck, B. T. Ruotolo, K. J. Gillig, and D. H. Russell, J. Am. Soc. Mass Spectrom. 15, 1320 (2004).
[25] H. H. Hill, W. F. Siems, and R. H. St. Louis, Anal. Chem. 62, 1201A (1990).
[26] J. A. Hornbeck and G. H. Wannier, Phys. Rev. 82, 458 (1951).
[27] J. A. Mclean, D. H. Russell, and J. A. Schultz, U.S. Pat. No. 7,081,617 B2 (25 Jul. 2006).
[28] D. E. Powers, S. G. Hansen, M. E. Geusic, D. L. Michalopoulos, and R. E. Smalley, J. Chem. Phys. 78, 2866 (1983).
[25] R. E. Leuchtner, A. C. Harms, and J. A. W. Castleman, J. Chem. Phys. 92, 6527 (1990).
[30] P. R. Kemper and M. T. Bowers, J. Phys. Chem. 95, 5134 (1991).
[31] J. P. K. Doye and D. J. Wales, Chem. Phys. Lett. 247, 339 (1995).
[32] V. G. Grigoryan, D. Alamanova, and M. Springborg, Phys. Rev. B 73, 115415 (2006).
[33] S. Gafner, S. Kosterin, and Y. Gafner, Phys. Solid State 49, 1558 (2007).
[34] P. Dugourd, R. R. Hudgins, and M. F. Jarrold, Chem. Phys. Lett. 267, 186 (1997).
[35] T. Yoshida, S. Takeyama, Y. Yamada, and K. Mutoh, Appl. Phys. Lett. 68, 1772 (1996).
[36] Z. Pászti, Z. E. Horvath, G. Petõ, A. Karacs, and L. Guczi, Appl. Surf. Sci. 109-110, 67 (1997).
[37] D. B. Geohegan, Appl. Phys. Lett. 60, 2732 (1992).
[38] N. Matsuki, T.- W. Kim, J. Ohta, and H. Fujioka, Solid State Commun. 136, 338 (2005).
[39] G. Oosterhout, Acta Crystallogr. 13, 932 (1960).

What is claimed is:

1. A system for depositing or patterning one or more ions, ionized nanoclusters, metal-ligand complexes, polymers, biopolymers, or any combinations thereof by soft-landing (SL) comprising:
a four-way and reducing cross housing with one or more standard conflat (CF) flanges;
a laser source generating a laser pulse or a radiation for an ionization of a target, a sample, a composition, or any combinations thereof;
a SL chamber housed in the four-way and reducing cross housing wherein the chamber comprises:
an opening or a quartz view-port attached to the four-way and reducing cross, wherein the laser pulse or the radiation enters the chamber through the opening or the view-port; and
a linear/rotational feed through line directly opposite the opening or the view-port, wherein the feed through line is inline with the incident radiation or pulse and is attached directly to the sample, a sample holder, or the target, wherein an electric potential can be optionally applied to the sample or the target supported by a fabricated porcelain or a machineable glass ceramic;
a drift tube for separating and thermalizing the one or more ions by collisions with a high pressure inert bath gas or gas mixture contained in the drift tube, wherein an electric potential can be applied to the drift tube, wherein the drift tube comprises:
one or more steel rings coupled by a series of vacuum resistors;
one or more thread rods isolated by spacers attached to two outer guard rings; and
one or more spacers placed in between the steel rings, wherein the spacers comprise sapphire spheres;
two split rings placed at the two ends of the drift tube, for directing an ion cluster beam emanating from the drift tube, wherein a pulsed voltage can be applied to the split rings;
a high voltage power supply for powering the drift tube, generating an electric field for the migration of the one or more ions, and providing a voltage to a first half of the split rings at one end of the drift tube, wherein the voltage is either a positive voltage or a negative voltage selected depending on a type of ion being analyzed;
a pulsing circuit for providing either a lower positive or a lower negative pulsed voltage in comparison to the drift tube voltage to a second half of split rings at an other end of the drift tube for a specified period of time, wherein the period of time encompasses a desired ion peak, wherein the pulsing circuit comprises: an optocoupler switch activated by one or more light emitting diodes (LEDs) and an integrated circuit (IC) metaloxide-semiconductor field effect transistor driver;
a rail system to hold and adjust a detector that comprises a Faraday plate connected to a preamp and an oscilloscope, and a landing surface for depositing or patterning the one or more ions, wherein the detector monitors the ion beam and collects a drift tube spectra;
a quick door (CF) flange to remove or replace the detector, the landing surface, and the sample; and
a rotary vane rough pump for allowing the system to attain a low pressure in a relatively short time.

2. The system of claim 1, further comprising one or more instruments for physical characterization selected from the group consisting of Secondary Ion Mass Spectrometry (SIMS), X-ray photoelectron spectroscopy (XPS), Atomic Force Microscopy (AFM), X-Ray Diffraction (XRD), Optical Interference Measurements (OIM), and scanning electron microscopy (SEM).

3. The system of claim 1, wherein the system operates at pressures ranging from 1 to 100 Torr.

4. The system of claim 1, wherein the high pressure inert bath gas or gas mixture comprises helium, argon, nitrogen, and mixtures and combinations thereof.

5. The system of claim 1, wherein the high pressure inert bath gas or gas mixture thermalizes the ions to energies ranging between 0.01 and 1.0 eV.

6. The system of claim 1, wherein the power supply provides a voltage ranging between 100 and 3000 V.

7. The system of claim 1, wherein the power supply creates an uniform electric field ranging between 5 and 150 V/cm.

8. The system of claim 1, wherein the landing surface is selected from the group consisting of Fe, Cr, Cu, Si, Mica, Au, $TiO_2$, a diamond surface, Ni, and $BaSO_4$.

9. The system of claim 1, wherein the surface is a Mica surface.

10. The system of claim 1, wherein the target is a Copper target.

* * * * *